United States Patent
Ishizuka et al.

(10) Patent No.: US 12,041,430 B2
(45) Date of Patent: Jul. 16, 2024

(54) CONTROL METHOD, CONTROL SYSTEM, AND STORAGE MEDIUM

(71) Applicant: YAMAHA CORPORATION, Hamamatsu (JP)

(72) Inventors: Kenji Ishizuka, Hamamatsu (JP); Kenichi Tamiya, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 361 days.

(21) Appl. No.: 17/701,028

(22) Filed: Mar. 22, 2022

(65) Prior Publication Data

US 2022/0217467 A1 Jul. 7, 2022

Related U.S. Application Data

(63) Continuation of application No. PCT/JP2020/013576, filed on Mar. 26, 2020.

(30) Foreign Application Priority Data

Sep. 30, 2019 (JP) ................. 2019-178672

(51) Int. Cl.
*H04R 3/04* (2006.01)
*H03H 17/06* (2006.01)
*H04R 29/00* (2006.01)

(52) U.S. Cl.
CPC ............. *H04R 3/04* (2013.01); *H04R 29/008* (2013.01); *H03H 17/06* (2013.01)

(58) Field of Classification Search
CPC ........ H04R 3/04; H04R 29/008; H03H 17/06; H03H 17/0294; H03H 2017/0297
See application file for complete search history.

(56) References Cited

U.S. PATENT DOCUMENTS

| | | | | | |
|---|---|---|---|---|---|
| 4,888,811 | A | * | 12/1989 | Takashi | H04R 3/04 381/98 |
| 2015/0139443 | A1 | * | 5/2015 | Okimoto | H04R 3/12 381/86 |
| 2021/0014609 | A1 | | 1/2021 | Ishizuka | |

FOREIGN PATENT DOCUMENTS

| | | | | |
|---|---|---|---|---|
| JP | 63234616 A | * | 9/1988 | ............ H03H 17/02 |
| JP | S63234616 A | | 9/1988 | |

(Continued)

OTHER PUBLICATIONS

International Search Report issued in Intl. Appln. No. PCT/JP2020/013576 mailed May 26, 2020. English translation provided.

(Continued)

*Primary Examiner* — Oyesola C Ojo
(74) *Attorney, Agent, or Firm* — ROSSI, KIMMS & McDOWELL LLP

(57) ABSTRACT

In a control method of controlling a frequency response of a filter for processing an audio signal, the frequency response is defined by an amplitude characteristic and a phase characteristic. The control method includes: acquiring a target amplitude characteristic, a target phase characteristic, and a latency value; obtaining a first frequency response in accordance with the target amplitude characteristic and the target phase characteristic; obtaining a second frequency response by modifying the first frequency response so that a latency of the second frequency response satisfies the latency value; and obtaining a third frequency response to be set for the filter by correcting the second frequency response, the second frequency response being corrected so as to reduce a difference between (i) an amplitude characteristic of the second frequency response and (ii) the target amplitude characteristic.

10 Claims, 8 Drawing Sheets

(56) References Cited

FOREIGN PATENT DOCUMENTS

| | | | | |
|---|---|---|---|---|
| JP | 01160207 A | * | 6/1989 | ............. H03H 17/02 |
| JP | H01160207 A | | 6/1989 | |
| JP | 2681349 B2 | | 11/1997 | |
| JP | 2013081243 | * | 5/2013 | ............. H03G 5/025 |
| JP | 2014050036 A | * | 3/2014 | ............. H03H 17/06 |
| JP | 2014050036 A | | 3/2014 | |
| WO | 2019181734 A1 | | 9/2019 | |

OTHER PUBLICATIONS

Written Opinion issued in Intl. Appln. No. PCT/JP2020/013576 mailed May 26, 2020.
English translation of Written Opinion issued in Intl. Appln. No. PCT/JP2020/013576 mailed on May 26, 2020, previously cited in IDS filed Mar. 22, 2022.
International Preliminary Report on Patentability issued in Intl. Appln. No. PCT/JP2020/013576 mailed on Apr. 5, 2022 English translation provided.

* cited by examiner

CONTROL METHOD, CONTROL SYSTEM, AND STORAGE MEDIUM

CROSS-REFERENCE TO RELATED APPLICATION

This application is a continuation application of International Application PCT/JP2020/013576 filed on Mar. 26, 2020, the content of this application is incorporated herein by reference in their entirety.

1. FIELD OF THE INVENTION

The present invention relates to a control method, a control system, and a storage medium.

2. DESCRIPTION OF THE RELATED ART

There is known a technology for controlling a frequency response of a filter to which an audio signal is input. JP 2681349 B2 includes description of a filter in which a target amplitude characteristic and a target phase characteristic are set independently of each other. This filter has a latency changed in accordance with the set target amplitude characteristic and the set target phase characteristic.

SUMMARY OF THE INVENTION

However, in the technology of JP 2681349 B2, no consideration is given to a case in which a latency has a predetermined value. The filter of Patent Literature 1 has a finite length, and hence a frequency response defined by a target amplitude characteristic and a target phase characteristic cannot be accommodated in the filter unless some compromise is made between the target amplitude characteristic and the target phase characteristic. When an attempt is made to accommodate the frequency response in the filter, there occurs a large difference between an amplitude characteristic of the frequency response and the target amplitude characteristic.

The present invention has been made in view of the above-mentioned problems, and an object thereof is to reduce a difference between an amplitude characteristic of a frequency response and a target amplitude characteristic.

Solution to Problem

In order to solve the above-mentioned problems, according to one embodiment of the present invention, there is provided a control method of controlling a frequency response of a filter for processing an audio signal, the frequency response being defined by an amplitude characteristic and a phase characteristic, the control method including: acquiring a target amplitude characteristic, a target phase characteristic, and a latency value; obtaining a first frequency response in accordance with the target amplitude characteristic and the target phase characteristic; obtaining a second frequency response by modifying the first frequency response so that a latency of the second frequency response satisfies the latency value; and obtaining a third frequency response to be set for the filter by correcting the second frequency response, the second frequency response being corrected so as to reduce a difference between (i) an amplitude characteristic of the second frequency response and (ii) the target amplitude characteristic.

According to one embodiment of the present invention, there is provided a control system for controlling a frequency response of a filter for processing an audio signal, the control system including: one or more processors; and one or more memories, wherein the frequency response is defined by an amplitude characteristic and a phase characteristic, and wherein the one or more processors are configured to execute a program stored in the one or more memories to cause the control system to: acquire a target amplitude characteristic, a target phase characteristic, and a latency value; obtain a first frequency response in accordance with the target amplitude characteristic and the target phase characteristic; obtain a second frequency response by modifying the first frequency response so that a latency of the second frequency response satisfies the latency value; and obtain a third frequency response to be set for the filter by correcting the second frequency response, the second frequency response being corrected by reducing a difference between (i) an amplitude characteristic of the second frequency response and (ii) the target amplitude characteristic.

According to one embodiment of the present invention, there is provided a storage medium including one or more storage media having stored thereon a computer-readable program for controlling a frequency response of a filter for processing an audio signal, wherein the frequency response is defined by an amplitude characteristic and a phase characteristic, and wherein the computer-readable program causes one or more processors to perform operations of: acquiring a target amplitude characteristic, a target phase characteristic, and a latency value; obtaining a first frequency response in accordance with the target amplitude characteristic and the target phase characteristic; obtaining a second frequency response by modifying the first frequency response so that a latency of the second frequency response satisfies the latency value; and obtaining a third frequency response to be set for the filter by correcting the second frequency response, the second frequency response being corrected by reducing a difference between (i) an amplitude characteristic of the second frequency response and (ii) the target amplitude characteristic.

DETAILED DESCRIPTION OF THE INVENTION

1. Hardware Configuration of Control Device

Figure 1:
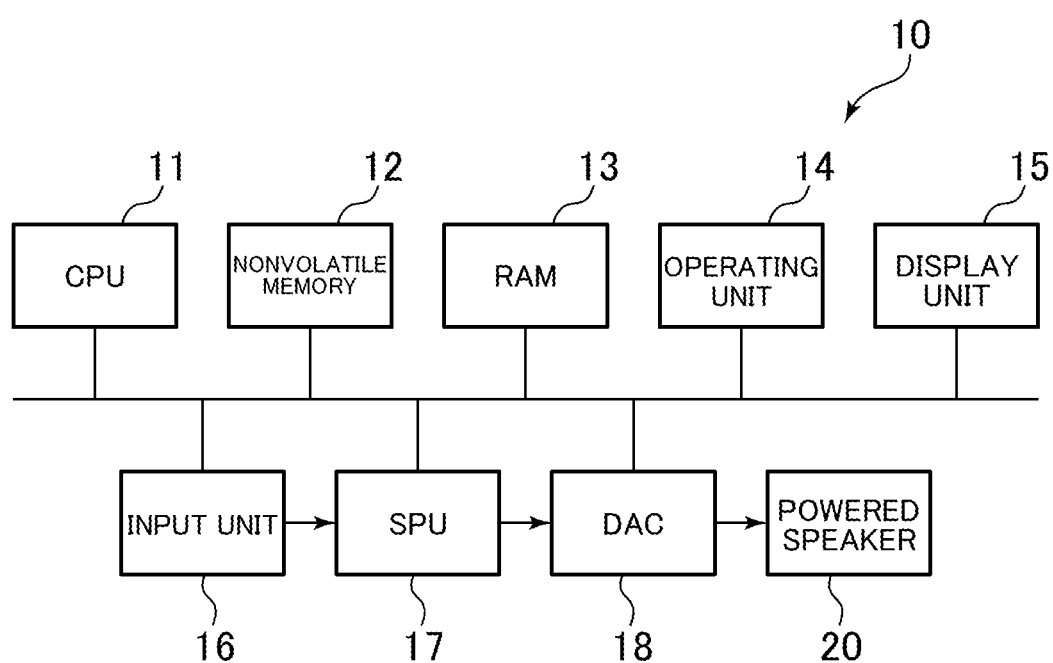
FIG. 1 is a diagram for illustrating an example of a control device according to an embodiment of the present invention.

Now, an example of an embodiment according to the present invention is described with reference to the accompanying drawings. FIG. 1 is a diagram for illustrating an example of a control device according to the embodiment. A control device 10 controls a frequency response of a filter for processing an audio signal. For example, the control device 10 is a digital mixer, a signal processor, an audio amplifier, an electronic musical instrument, a personal computer, a tablet terminal, a smartphone, or a digital assistant.

The audio signal is a digital or analog signal representing a sound. The filter is a circuit for processing an input audio signal and outputs the processed audio signal. The filter in this embodiment is a finite impulse response (FIR) filter having a finite length. The frequency response is a filter characteristic on a time axis. The frequency response is defined by an amplitude characteristic and a phase characteristic. The frequency response is used for setting a coefficient for the filter. The controlling of the frequency response refers to obtaining of the frequency response.

In this embodiment, "obtaining" means obtaining as a result of processing. For example, the frequency response is obtained as a result of processing, for example, inverse Fourier transform, and hence the control device 10 "obtains" the frequency response. The "obtaining" can also be rephrased as creating, defining, or generating. Meanwhile, "acquiring" means receiving. For example, information set by a user operation is received from the outside, and hence the control device 10 acquires the set information. The "acquiring" can also be rephrased as receiving. In this embodiment, the "obtaining" and the "acquiring" are thus used properly.

As illustrated in FIG. 1, the control device 10 includes a CPU 11, a nonvolatile memory 12, a RAM 13, an operating unit 14, a display unit 15, an input unit 16, a signal processing unit (SPU) 17, and a digital analog converter (DAC) 18. The control device 10 is connected to a powered speaker 20. The speaker 20 may be integrally provided to the control device 10.

The CPU 11 includes at least one processor. The CPU 11 executes predetermined process based on a program and data that are stored in the nonvolatile memory 12. The nonvolatile memory 12 is a memory, for example, a ROM, an EEPROM, a flash memory, or a hard disk drive. The RAM 13 is an example of a volatile memory. The operating unit 14 is an input device, for example, a touch panel, a keyboard, a mouse, a button, or a lever. The display unit 15 is a display, for example, a liquid crystal display or an organic EL display.

The input unit 16 acquires an audio signal. In this embodiment, the input unit 16 acquires a digital audio signal. The input unit 16 may acquire an analog audio signal. In this case, the input unit 16 converts an analog audio signal into a digital audio signal through use of an A/D converter. For example, the input unit 16 includes an interface for receiving input of an audio signal from the outside. The input unit 16 may acquire audio data stored in the nonvolatile memory 12. The input unit 16 inputs the acquired audio signal to the SPU 17. The SPU 17 includes a filter for processing the input audio signal.

Figure 2:
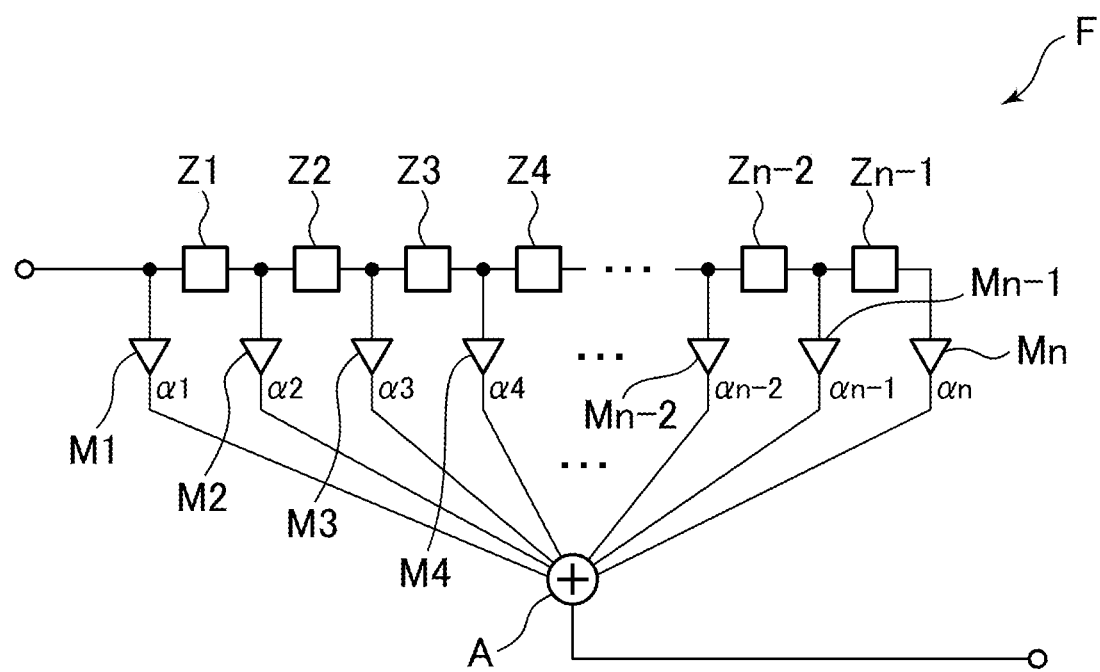
FIG. 2 is a diagram for illustrating an example of a filter of an SPU.

FIG. 2 is a diagram for illustrating an example of the filter of the SPU 17. As illustrated in FIG. 2, a filter F includes delay circuits Z1 to Zn-1 and multipliers M1 to Mn. The variable "n" represents the number of taps of the filter F. The variable "n" may be any natural number. Coefficients α1 to αn are set for the multipliers M1 to Mn, respectively. The coefficients α1 to αn are values corresponding to a third frequency response described later. The filter F is an FIR filter for convolving the coefficients α1 to αn into an audio signal.

The audio signal input from the input unit 16 is input to the multiplier M1 and the delay circuit Z1. The audio signal input to the delay circuit Z1 is delayed by a predetermined time period, and input to the multiplier M2 and the delay circuit Z2. After that, in the same manner, the audio signal is delayed by each of the delay circuits Z3 to Zn-1. The delayed audio signal is input to each of the multipliers M3 to Mn.

The multipliers M1 to Mn each multiply the audio signal input to itself by each of the coefficients α1 to αn, respectively. Each of the multipliers M1 to Mn inputs the audio signal multiplied by its own one of the coefficients α1 to αn to an adder A. The adder A adds up the audio signals output from the multipliers M1 to Mn. The adder A inputs the added audio signals to the DAC 18.

The DAC 18 is a circuit for converting a digital audio signal into an analog audio signal. The DAC 18 outputs the converted analog audio signal to the powered speaker 20. The speaker 20 outputs a sound corresponding to the input analog audio signal.

The hardware configuration of the control device 10 is not limited to the above-mentioned example. For example, the control device 10 may include a communication interface for wired communication or wireless communication. In addition, for example, the control device 10 may include a reading device (for example, an optical disc drive or a memory card slot) for reading a computer-readable information storage medium. In addition, for example, the control device 10 may include an input/output terminal (for example, a USB port) for inputting/outputting data. The program and data described as being stored in the nonvolatile memory 12 in this embodiment may be supplied to the control device 10 through the communication interface, the reading device, or the input/output terminal.

2. Functions to be Implemented by Control Device

Figure 3:
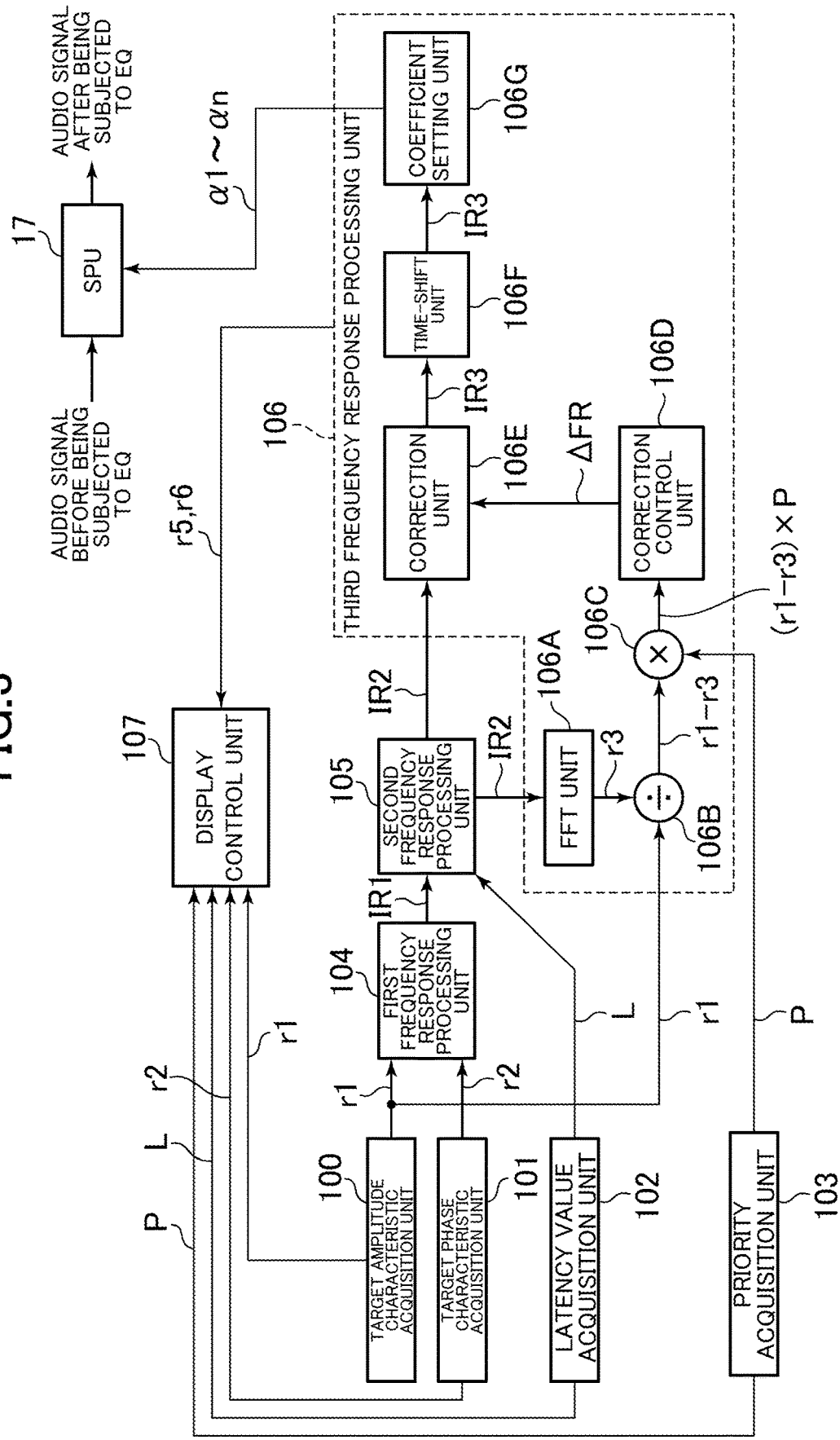
FIG. 3 is a block diagram for illustrating an example of functions implemented by the control device.
Figure 4:
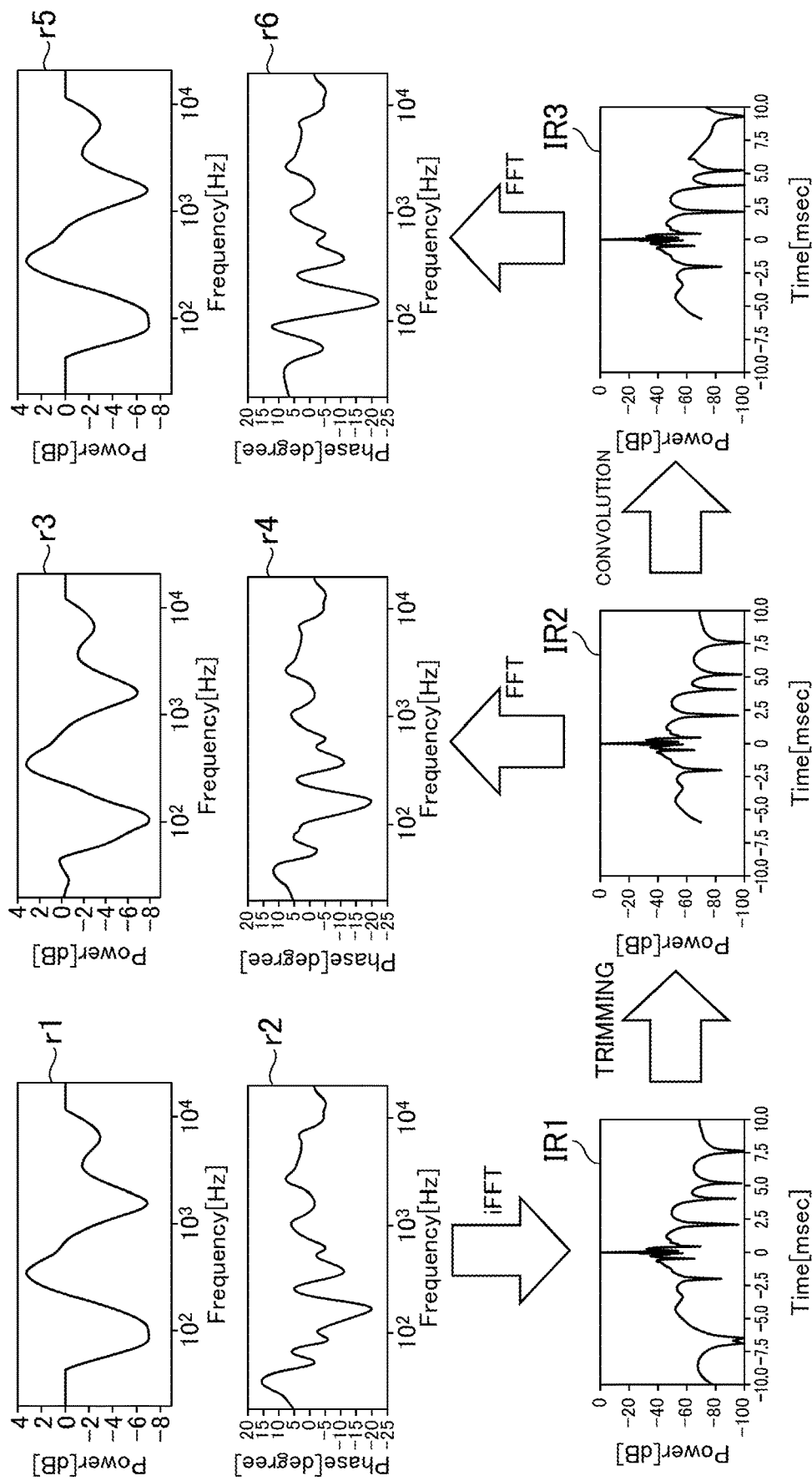
FIG. 4 is a diagram for illustrating an example of frequency responses controlled by the control device.

FIG. 3 is a block diagram for illustrating an example of functional units to be implemented by the control device 10. FIG. 4 is a diagram for illustrating an example of the frequency responses controlled by the control device 10. As illustrated in FIG. 3, in the control device 10, a first acquisition unit 100 (target amplitude characteristic acquisition unit), a second acquisition unit 101 (target phase characteristic acquisition unit), a third acquisition unit 102 (latency value acquisition unit), a fourth acquisition unit 103 (priority acquisition unit), a first processing unit 104 (first frequency response processing unit), a second processing unit 105 (second frequency response processing unit), a third processing unit 106 (third frequency response processing unit), and a display control unit 107 are implemented. Those functions are implemented mainly by the CPU 11.

[2-1. First Acquisition Unit (Target Amplitude Characteristic Acquisition Unit)]

The first acquisition unit 100 acquires a target amplitude characteristic r1. The target amplitude characteristic r1 is a target amplitude characteristic (ideal amplitude characteristic). The amplitude characteristic is a characteristic of an amplitude on a frequency axis. As illustrated in FIG. 4, the horizontal axis of the target amplitude characteristic r1 indicates a frequency. The vertical axis of the target amplitude characteristic r1 indicates an amplitude change (gain). A curve of the target amplitude characteristic r1 indicates a magnitude of the amplitude for each frequency.

In this embodiment, the target amplitude characteristic r1 is set in accordance with a user operation. For example, a user sets the target amplitude characteristic r1 on a filter control screen described later. The first acquisition unit 100 acquires the target amplitude characteristic r1 set by the user operation, and records the target amplitude characteristic r1 in the RAM 13. The user operation is not limited to the operation on the filter control screen, and may be another operation using the operating unit 14. For example, the target amplitude characteristic r1 may be set directly from the button, lever, or the like of the operating unit 14 instead of the user operation using a screen.

The target amplitude characteristic r1 is not required to be set by the user. In this case, the target amplitude characteristic r1 indicates a predetermined curve. For example, this target amplitude characteristic r1 is stored in advance in the nonvolatile memory 12. The first acquisition unit 100 acquires the target amplitude characteristic r1 stored in advance in the nonvolatile memory 12. A plurality of target amplitude characteristics r1 may be stored in advance in the nonvolatile memory 12. In this case, the first acquisition unit 100 acquires any one of the plurality of target amplitude characteristics r1. For example, the first acquisition unit 100 acquires the target amplitude characteristic r1 selected by the user. The target amplitude characteristic r1 may be automatically set based on a frequency amplitude characteristic of a room, which has been measured by emitting a test sound from the speaker 20. For example, such a target amplitude characteristic r1 as to suppress a peak of the frequency amplitude characteristic may be automatically set.

[2-2. Second Acquisition Unit (Target Phase Characteristic Acquisition Unit)]

The second acquisition unit 101 acquires a target phase characteristic r2. The target phase characteristic r2 is a target phase characteristic (ideal phase characteristic). The phase characteristic is a characteristic of the phase on the frequency axis. As illustrated in FIG. 4, the horizontal axis of the target phase characteristic r2 indicates a frequency. The vertical axis of the target phase characteristic r2 indicates a phase change (degree of lead or lag). A curve of the target phase characteristic r2 indicates the phase change for each frequency.

In this embodiment, the target phase characteristic r2 is set in accordance with a user operation. For example, a user sets the target phase characteristic r2 on the filter control screen described later. The second acquisition unit 101 acquires the target phase characteristic r2 set by the user operation, and records the target phase characteristic r2 in the RAM 13. The user operation is not limited to the operation on the filter control screen, and may be another operation using the operating unit 14. For example, the target phase characteristic r2 may be set directly from the button, lever, or the like of the operating unit 14 instead of the user operation using a screen.

The target phase characteristic r2 is not required to be set by the user. In this case, the target phase characteristic r2 indicates a predetermined curve. For example, this target phase characteristic is stored in advance in the nonvolatile memory 12. The second acquisition unit 101 acquires the target phase characteristic r2 stored in advance in the non-volatile memory 12. A plurality of target phase characteristics r2 may be stored in advance in the nonvolatile memory 12. In this case, the second acquisition unit 101 acquires any one of the plurality of target phase characteristics r2. For example, the second acquisition unit 101 acquires the target phase characteristic r2 selected by the user. The target phase characteristic r2 may be automatically set based on a frequency phase characteristic of a room, which has been measured by emitting a test sound from the speaker 20. For example, such a target phase characteristic r2 as to smooth the frequency phase characteristic may be automatically set.

[2-3. Third Acquisition Unit (Latency Value Acquisition Unit)]

The third acquisition unit 102 acquires a latency value L. The latency value L is a numerical value indicating a latency (time length) of the filter. The latency is a delay of the audio signal that has passed through the filter from the audio signal input to the filter. As the latency value L becomes larger, the sound is further delayed by the filter. The latency value L is represented by a numerical value within a numerical range defined in advance. For example, the latency value L is represented by a numerical value of 0 milliseconds or more and T milliseconds or less. The variable T represents a positive number indicating an upper limit value of the latency value L.

In this embodiment, the latency value L is set in accordance with a user operation. For example, the user sets the latency value L on the filter screen described later. The third acquisition unit 102 acquires the latency value L set by the user operation, and records the latency value L in the RAM 13. The user operation is not limited to the operation on the filter control screen, and may be another operation using the operating unit 14. For example, the latency value L may be set directly from the button, lever, or the like of the operating unit 14 instead of the user operation using the screen.

The latency value L is not required to be set by the user. In this case, the latency value L is a value defined in advance. For example, this latency value L is stored in advance in the nonvolatile memory 12. The third acquisition unit 102 acquires the latency value L stored in advance in the nonvolatile memory 12. A plurality of latency values L may be stored in advance in the nonvolatile memory 12. In this case, the third acquisition unit 102 acquires any one of the plurality of latency values L. For example, the third acquisition unit 102 acquires the latency value L selected by the user.

[2-4. Fourth Acquisition Unit (Priority Acquisition Unit)]

The fourth acquisition unit 103 acquires a priority P. The priority P is a numerical value representing a degree of correction of the frequency response. For example, the priority P represents a ratio of correction of the amplitude characteristic. In this case, the frequency response is corrected so that the amplitude characteristic is further prioritized as the priority P becomes higher. The priority P is represented by a numerical value within a numerical range defined in advance. For example, the priority P is represented by a numerical value of 0 or more and 1 or less.

In this embodiment, the priority P is set in accordance with a user operation. For example, the user sets the priority P on the filter screen described later. The fourth acquisition unit 103 acquires the priority P set by the user operation, and records the priority P in the RAM 13. The user operation is not limited to the operation on the filter control screen, and may be another operation using the operating unit 14. For example, the priority P may be set directly from the button, lever, or the like of the operating unit 14 instead of the user operation using the screen.

The priority P is not required to be set by the user. In this case, the priority P is a value defined in advance. For example, this priority P is stored in advance in the nonvolatile memory 12. The fourth acquisition unit 103 acquires the priority P stored in advance in the nonvolatile memory 12. A plurality of priorities P may be stored in advance in the nonvolatile memory 12. In this case, the fourth acquisition unit 103 acquires any one of the plurality of priorities P. For example, the fourth acquisition unit 103 acquires the priority P selected by the user. In another case, the priority P may be automatically determined based on a predetermined rule. For example, the value of the priority P may be automatically determined based on a Euclidean distance between the amplitude characteristic of the filter and the target amplitude characteristic.

[2-5. First Processing Unit (First Frequency Response Processing Unit)]

The first processing unit 104 obtains a first impulse response IR1 in accordance with a first frequency response FR1 including the target amplitude characteristic r1 and the target phase characteristic r2. The response FR1 in a frequency domain is equivalent to the response IR in a time domain.

As illustrated in FIG. 4, the first processing unit 104 performs inverse Fourier transform (iFFT) on the response FR1 to obtain the response IR1. The response FR1 is transformed from the frequency domain to the time domain by the inverse Fourier transform. Consequently, the horizontal axis of the response IR1 indicates time. The vertical axis of the response IR1 indicates a magnitude (power in FIG. 4) of the coefficient of the filter F. The curve of response IR1 indicates the magnitude of the coefficient for each time (for each tap). In addition, the response IR1 has a peak near the center (time zero). When a frequency resolution of the response FR1 is equal to or less than a resolution corresponding to the number of taps of the filter F, the obtained response IR1 accurately corresponds to the response FR1. When the frequency resolution of the response FR1 is higher than the resolution corresponding to the number of taps of the filter F, the obtained response IR1 includes an error.

[2-6. Second Processing Unit (Second Frequency Response Processing Unit)]

The second processing unit 105 modifies the response IR1 so that a latency according to the response IR1 satisfies the latency value L, to thereby obtain a second impulse response IR2. The response IR2 corresponds to a second frequency response FR2, which has a predetermined latency, and is close to the response FR1.

For example, the second processing unit 105 trims (deletes) a portion of the response IR1 before a negative time, which corresponds to the latency, so as to satisfy the latency value L set by the user, to thereby obtain the second impulse response IR2. The trimming is an example of modifying for eliminating a leading part of an impulse response. Through the trimming, the corresponding response FR1 is substantially modified. Deforming, replacing, or amending the curve of the response FR1 or response IR1 corresponds to the modifying. The modifying may be performed on the response FR1 in the frequency domain.

The second processing unit 105 trims the response IR1 so that a latency according to a curve after the trimming satisfies the latency value L. For example, the second processing unit 105 determines an amount (length) of trimming a head of the curve based on the latency value L. For example, the second processing unit 105 trims the response IR1 so that a period from the left end of the curve to the peak has a time length corresponding to the latency value L. As the latency value L becomes larger, the trimming amount becomes smaller. Energy of the audio signal that has passed through the filter is reduced due to this trimming, and hence such modifying as to compensate for the reduction may be performed.

[2-7. Third Processing Unit (Third Frequency Response Processing Unit)]

The third processing unit 106 corrects the response IR2 so that a difference between an amplitude characteristic r3 of the second frequency response FR2 corresponding to the response IR2 and the target amplitude characteristic r1 is reduced, to thereby obtain a third impulse response IR3 to be set for the filter F. The response IR3 corresponds to a third frequency response FR3, which has a predetermined latency, and has been corrected to become closer to the target amplitude characteristic r1. The response FR2 (amplitude characteristic r3 and phase characteristic r4) is obtained by Fourier-transforming the response IR2, and is equivalent to the response IR2.

For example, the third processing unit 106 includes an FFT unit 106A, a division unit 106B, a multiplication unit 106C, a correction control unit 106D, a correction unit 106E, a time-shift unit 106F, and a coefficient setting unit 106G. The FFT unit 106A performs Fourier transform (FFT) on the response IR2 to obtain the response FR2 including the amplitude characteristic r3 and the phase characteristic r4. As illustrated in FIG. 4, the trimming performed by the second processing unit 105 causes a difference between the target amplitude characteristic r1 and the amplitude characteristic r3. When this difference is large, the user wishes to bring the amplitude characteristic r3 closer to the original target amplitude characteristic r1. In view of this, in this embodiment, the response FR2 is corrected so as to reduce this difference.

In this respect, as illustrated in FIG. 4, the trimming performed by the second processing unit 105 also causes a difference between the target phase characteristic r2 and the phase characteristic r4. In this case, the difference between the target amplitude characteristic r1 and the amplitude characteristic r3 and the difference between the target phase characteristic r2 and the phase characteristic r4 are in a trade-off relationship. As one of the differences becomes smaller, the other difference becomes larger. The degree of correction of the response FR2 is determined based on the priority P. In this embodiment, the response FR2 or the response IR2 is corrected in accordance with the priority P in the following manner.

The division unit 106B calculates an amplitude characteristic $\Delta r$ of the difference between the target amplitude characteristic r1 and the amplitude characteristic r3. This difference is calculated by subtracting a decibel value in the frequency domain. The subtraction of the decibel value corresponds to division of a linear value, and is therefore indicated by a division sign in FIG. 3. The multiplication unit 106C multiplies the amplitude characteristic $\Delta r$ of the difference, which is a calculation result of the division unit 106B, by the priority P. The correction control unit 106D obtains a frequency response $\Delta FR$ for correction corresponding to the amplitude characteristic being a calculation result of the multiplication unit 106C. The amplitude characteristic $\Delta FR$ for correction is obtained by a minimum phase. For the minimum phase, a known technology can be used.

The correction unit 106E corrects the response IR2 in accordance with the frequency response $\Delta FR$ for correction to obtain the third impulse response IR3. Transforming, restoring, or compensating the curve of the response FR2 or response IR2 itself so that the amplitude characteristic r3 of the third frequency response FR3 corresponding to the response IR3 becomes closer to the target amplitude characteristic r1 corresponds to the correcting. This correction is, for example, a process for obtaining the response IR3 by convolving an impulse response ΔIR corresponding to the response ΔFR into the response IR2. As illustrated in FIG. 4, a difference between the target amplitude characteristic r1 and an amplitude characteristic r5 of the response FR3 is smaller than the difference between the target amplitude characteristic r1 and the amplitude characteristic r3 of the response FR2. The response FR3 is obtained by Fourier-transforming the response IR3, and is equivalent to the response IR3.

The time-shift unit 106F time-shifts the response IR3. Due to the time-shifting, the head (leftmost portion) of the curve indicated by the response IR3 becomes t=0. The coefficient setting unit 106G sets a value on the curve at t=0 as the coefficient α1 for the first tap. The coefficient setting unit 106G sets values on the curve corresponding to a predetermined sampling interval Δt as the coefficients α2 to αn for the second tap and the subsequent taps. The setting of the coefficients α1 to αn refers to rewriting of the values of the coefficients α1 to αn.

As described above, the third processing unit 106 changes the degree of correction of the response IR2 based on the priority P. The degree of correction refers to a degree to which the amplitude characteristic r3 of the response FR3 is brought closer to the target amplitude characteristic r1. The degree of correction can also be referred to as a correction amount. For example, a relationship between the priority P and the degree of correction is defined in a program code. This relationship may be defined in a mathematical expression or a table in place of the program code. The third processing unit 106 corrects the response IR2 based on the degree of correction corresponding to the priority P.

Figure 5:
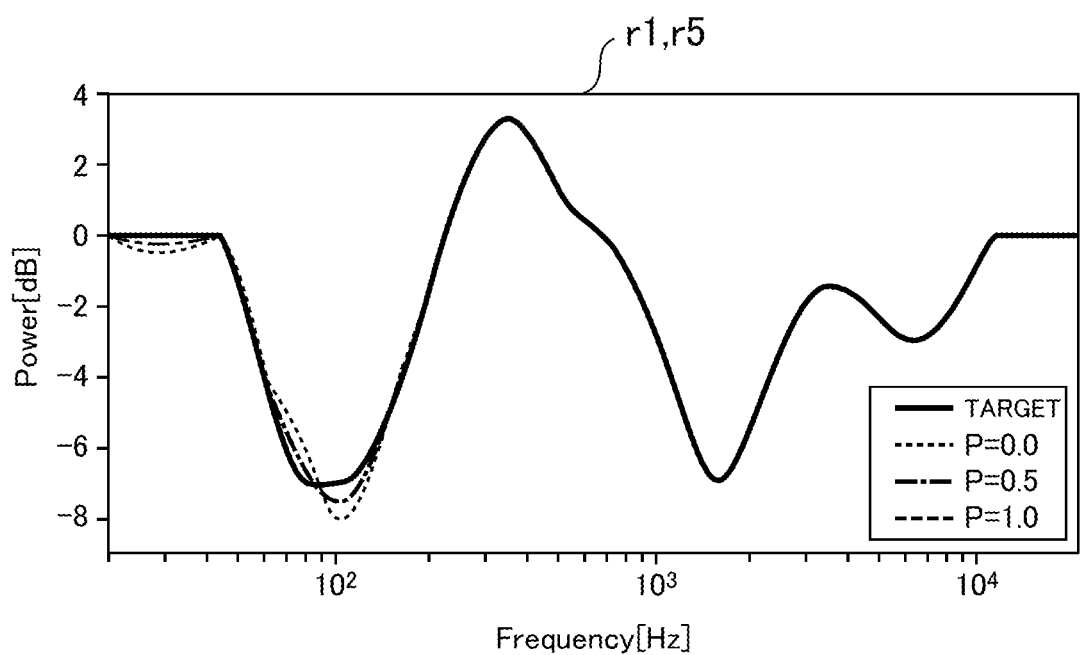
FIG. 5 is a graph for showing how an amplitude characteristic of a third frequency response is changed in accordance with a priority.

FIG. 5 is a graph for showing how the amplitude characteristic r5 of the response FR3 is changed in accordance with the priority P. In FIG. 5, the curve of the target amplitude characteristic r1 is indicated by the solid line. The curve of the amplitude characteristic r5 is indicated by the lines (dotted line, broken line, and one-dot chain line) other than the solid line. As shown in FIG. 5, when the priority P is changed so as to prioritize the amplitude characteristic r5, the difference between the amplitude characteristic r5 of the response FR3 and the target amplitude characteristic r1 becomes smaller. For example, as the priority P becomes higher, the difference between the amplitude characteristic r5 of the response FR3 and the target amplitude characteristic r1 becomes smaller. In the example of FIG. 5, when the priority P is 1, the amplitude characteristic r5 and the target amplitude characteristic r1 match each other.

Figure 6:
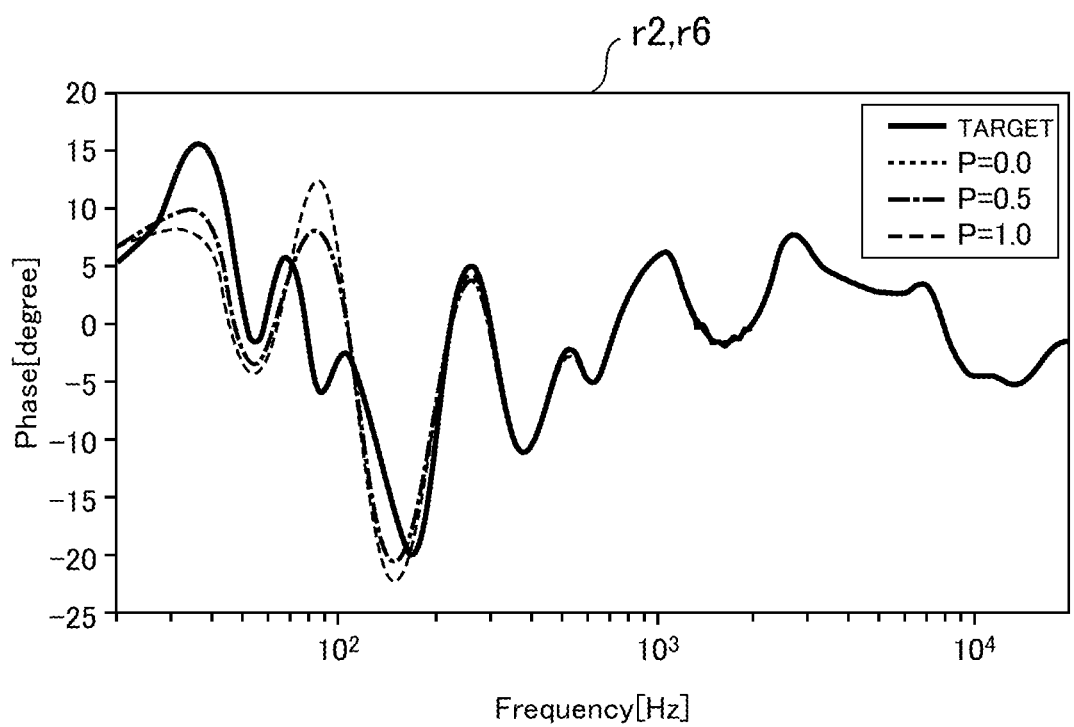
FIG. 6 is a graph for showing how a phase characteristic of the third frequency response is changed in accordance with the priority.

FIG. 6 is a graph for showing how a phase characteristic r6 of the response FR3 is changed in accordance with the priority P. In FIG. 6, the curve of the target phase characteristic r2 is indicated by the solid line. The curve of the phase characteristic r6 is indicated by the lines (dotted line, broken line, and one-dot chain line) other than the solid line. As shown in FIG. 6, when the priority P is changed so as to prioritize the phase characteristic r6, the difference between the phase characteristic r6 of the response FR3 and the target phase characteristic r2 becomes smaller. For example, as the priority P becomes lower, the difference between the phase characteristic r6 of the response FR3 and the target phase characteristic r2 becomes smaller.

[2-8. Display Control Unit]

Figure 7:
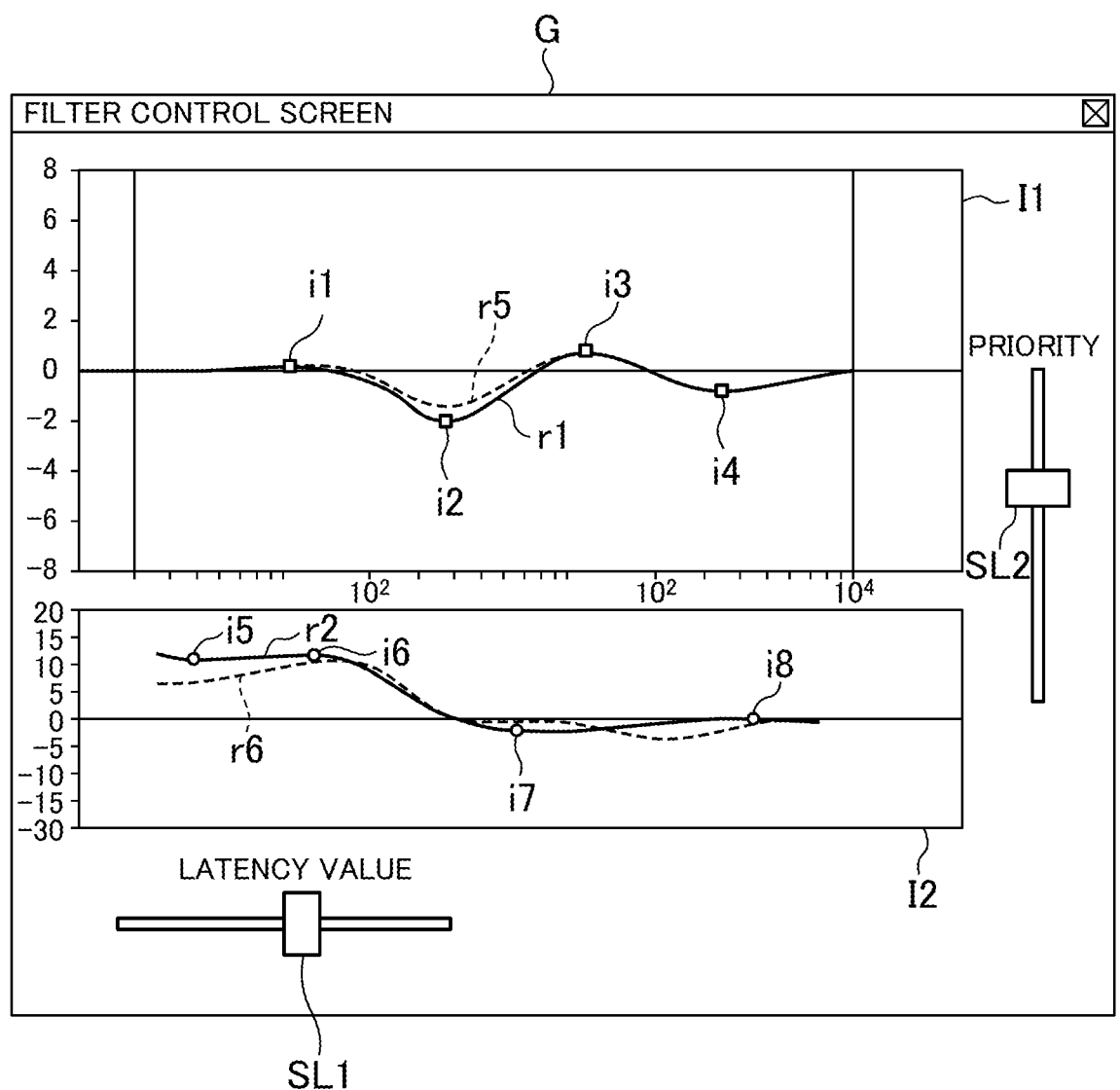
FIG. 7 is a diagram for illustrating an example of a filter control screen.

The display control unit 107 causes the display unit 15 to display the filter control screen. FIG. 7 is a diagram for illustrating an example of the filter control screen. The filter control screen is a user interface for performing work of setting the filter F. As illustrated in FIG. 7, an amplitude characteristic image I1, a phase characteristic image I2, a latency value slider SL1, and a priority slider SL2 are displayed on a filter control screen G.

The target amplitude characteristic r1 and the amplitude characteristic r5 of the response FR3 are displayed in the amplitude characteristic image I1. In the example of FIG. 7, the curve of the target amplitude characteristic r1 is indicated by the solid line. The curve of the amplitude characteristic r5 is indicated by the broken line. The user sets the target amplitude characteristic r1 by changing the curve shape of the solid line through, for example, a dragging operation of the mouse. For example, the user changes the curve of the solid line by moving each of icons i1 to i4 on the curve. When the curve of the target amplitude characteristic r1 is changed, the response FR3 is updated according to the changed target amplitude characteristic, and the curve of the amplitude characteristic r5 is changed accordingly. The user can add a new icon to the curve at any position, or delete an unnecessary existing icon.

The target phase characteristic r2 and the phase characteristic r6 of the response FR3 are displayed in the phase characteristic image I2. In the example of FIG. 7, the curve of the target phase characteristic r2 is indicated by the solid line. The curve of the phase characteristic r6 is indicated by the broken line. The user sets the target phase characteristic r2 by changing the curve shape of the solid line through, for example, a dragging operation of the mouse. For example, the user changes the curve of the solid line by moving each of icons i5 to i8 on the curve. When the curve of the target phase characteristic r2 is changed, the response FR3 is updated according to the changed target phase characteristic r2, and the curve of the phase characteristic r6 is changed accordingly.

The latency value slider SL1 is an image for receiving setting of the latency value L. The user sets the latency value L by moving a knob of the slider SL1 through, for example, a dragging operation of the mouse. For example, the user sets the latency value L by moving the knob of the slider SL1 horizontally. In the example of FIG. 7, the latency value L increases as the knob of the slider SL1 is moved further to the rightward direction (along the horizontal axis direction). When the latency value L is changed, a degree of trimming is changed, the response FR3 is updated according to the changed degree of trimming, and the curves of the amplitude characteristic r5 and the phase characteristic r6 are changed accordingly.

The priority slider SL2 is an image for setting the priority P. The user sets the priority P by moving a knob of the slider SL2 through, for example, a dragging operation of the mouse. For example, the user sets the priority P by moving the knob of the slider SL2 vertically. In the example of FIG. 7, the priority P is changed so that the amplitude characteristic is further prioritized as the knob of the slider SL2 moves further to the upward direction (toward the direction of the amplitude characteristic image I1). The priority P is changed so that the phase characteristic is further prioritized as the knob of the slider SL2 moves further to the downward direction (toward the direction of the phase characteristic image I2). When the priority P is changed, that means the degree of correction is changed, the response FR3 is updated according to the changed priority P, and the curves of the amplitude characteristic r5 and the phase characteristic r6 are changed accordingly.

As described above, the display control unit 107 may cause the display unit 15 to display both a pair of the amplitude characteristic r5 of the response FR3 and the target amplitude characteristic r1 and a pair of the phase characteristic r6 and the target phase characteristic r2 in a comparable manner. The display control unit 107 may cause only one of the pairs to be displayed in a comparable manner. That is, any one of the amplitude characteristic image I1 and the phase characteristic image I2 may be displayed.

The displaying in a comparable manner refers to displaying of two characteristics in comparison. The two characteristics may be distinguished in any manner, and are not limited to being distinguished by the solid line and the broken line as illustrated in FIG. 7. For example, the two characteristics may be distinguished by lines having mutually different colors or lines having mutually different values of thickness. In addition, for example, instead of overlaying the two curves in the same area in a comparable manner, the curves may be arranged vertically or horizontally in a comparable manner.

3. Process to be Executed by Control Device

Figure 8:
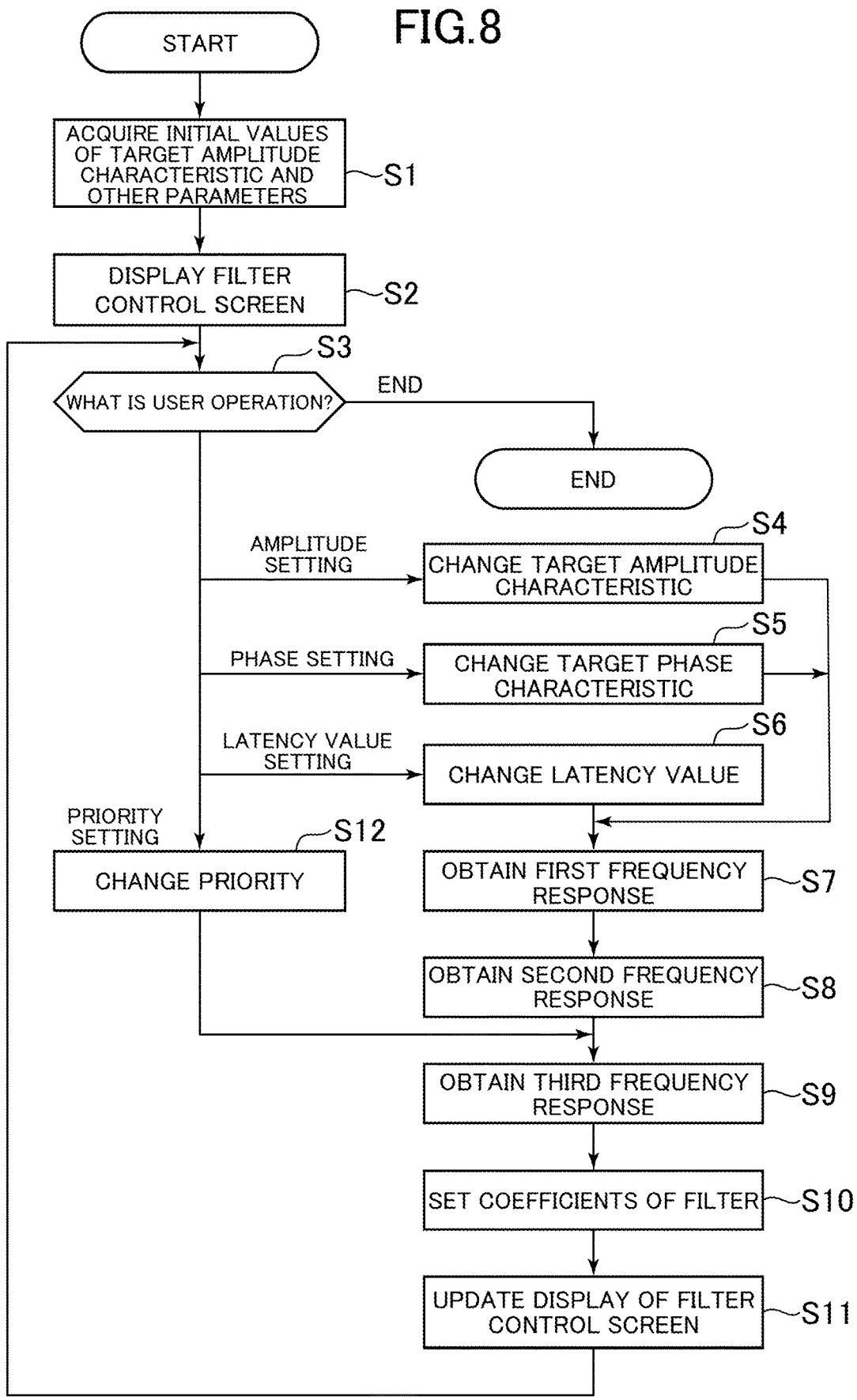
FIG. 8 is a flow chart for illustrating an example of a process to be executed by the control device.

FIG. 8 is a flow chart for illustrating an example of a process to be executed by the control device 10. The process illustrated in FIG. 8 is executed by the CPU 11 operating in accordance with the program stored in the nonvolatile memory 12. This process is an example of processes to be executed by the functional units illustrated in FIG. 3.

As illustrated in FIG. 8, the CPU 11 acquires initial values of the target amplitude characteristic r1, the target phase characteristic r2, the latency value L, and the priority P (Step S1). It is assumed that those initial values are stored in advance in the nonvolatile memory 12. When previous settings are present in the nonvolatile memory 12, the values in the previous settings are acquired as the initial values. When the previous setting is not present in the nonvolatile memory 12, initial values preset by a program creator are acquired. The initial values acquired in Step S1 are temporarily recorded in the RAM 13.

The CPU 11 displays the filter control screen G on the display unit 15 based on the initial values acquired in Step S1 (Step S2). The CPU 11 receives a user operation from the operating unit 14 (Step S3). The user performs any one of an amplitude setting operation of changing the curve shape of the target amplitude characteristic r1, a phase setting operation of changing the curve shape of the target phase characteristic r2, a latency value setting operation of moving the latency value slider SL1, a priority setting operation of moving the priority slider SL2, and a predetermined end operation.

When the amplitude setting operation is received (Step S3: amplitude setting), the CPU 11 changes the target amplitude characteristic r1 recorded in the RAM 13 (Step S4). The target amplitude characteristic r1 is changed so as to show a curve that has been changed. The curve of the solid line in the amplitude characteristic image I1 is updated in accordance with the amplitude setting operation.

When the phase setting operation is received (Step S3: phase setting), the CPU 11 changes the target phase characteristic r2 recorded in the RAM 13 (Step S5). The target phase characteristic r2 is changed so as to show a curve that has been changed. The curve of the solid line in the phase characteristic image I2 is updated in accordance with the phase setting operation.

When the latency value setting operation is received (Step S3: latency value setting), the CPU 11 changes the latency value L recorded in the RAM 13 (Step S6). The latency value L becomes a value corresponding to a position of the latency value slider SL1.

The CPU 11 obtains the response FR1 in accordance with the target amplitude characteristic r1 and the target phase characteristic r2 (Step S7). In Step S7, the CPU 11 inverse-Fourier-transforms the response FR1 including the target amplitude characteristic r1 and the target phase characteristic r2 to obtain the response IR1.

The CPU 11 trims the response IR1 so that the latency according to the response IR1 satisfies the latency value L, to thereby obtain the response IR2 (Step S8). In Step S8, the CPU 11 trims a head portion of the response IR1 in accordance with the latency value L. The CPU 11 Fourier-transforms the response IR2 to obtain the response FR2.

The CPU 11 corrects, based on the priority P, the response IR2 so that the difference between the amplitude characteristic r3 of the response FR2 and the target amplitude characteristic r1 is reduced, to thereby obtain the response IR3 (Step S9). In Step S9, the CPU 11 first obtains the amplitude characteristic for correction by multiplying the difference between the target amplitude characteristic r1 and the amplitude characteristic r3 of the response FR2 by the priority P, transforms the amplitude characteristic for correction into the response ΔIR for correction under a condition for the minimum phase, and convolves the response ΔIR into the response IR2, to thereby obtain the response IR3.

The CPU 11 time-shifts the response IR3, and sets the coefficients α1 to αn of the filter F (Step S10). Each of the coefficients α1 to αn becomes a value on the curve of the time-shifted response IR3.

The CPU 11 updates the display of the filter control screen G (Step S11). In Step S11, the CPU 11 Fourier-transforms the response IR3 to obtain the response FR3 including the amplitude characteristic r5 and the phase characteristic r6. The curve of the broken line in the amplitude characteristic image I1 is updated so as to indicate the amplitude characteristic r5. The curve of the broken line in the phase characteristic image I2 is updated so as to indicate the phase characteristic r6.

When the priority setting operation is received in Step S3 (Step S3: priority setting), the CPU 11 changes the priority P recorded in the RAM 13 (Step S12). After that, Steps S9 to S11 are executed. The priority P does not affect the curve of the response IR1 and the curve of the response IR2. For that reason, after Step S12, Step S7 and Step S8 are not executed. The omission of Step S7 and Step S8 enables the response IR3 to be quickly obtained. Undesired process is not executed, and hence it is possible to reduce a processing load on the control device 10.

When Step S11 is executed, the procedure returns to Step S3. The process described above is repeated until the desired amplitude characteristic r5 and phase characteristic r6 are obtained. When the desired amplitude characteristic r5 and phase characteristic r6 are obtained, the user performs the predetermined end operation. When the end operation is received in Step S3 (Step S3: end operation), this process is brought to an end. The audio signal filtering process using the coefficients α1 to αn in the SPU 17 is continued even after the end of this process. When the end operation is received, the latest target amplitude characteristic r1, target phase characteristic r2, latency value L, and priority P that are stored in the RAM 13 are recorded in the nonvolatile memory 12. Those recorded values are acquired as initial values in Step S1 when the process of FIG. 8 is executed again.

The control device 10 in this embodiment trims the response IR1 so as to satisfy the latency value L, to thereby obtain the response IR2. The control device 10 corrects the response IR2 so as to reduce the difference between the amplitude characteristic r3 of the response FR2 and the target amplitude characteristic r1, to thereby obtain the response IR3. Thus, it is possible to reduce the difference between the amplitude characteristic r5 to be set for the filter F and the target amplitude characteristic r1. The sound modified by the filter F having the corrected response IR3 is output from the speaker 20.

In addition, the control device 10 sets the target amplitude characteristic r1 and the target phase characteristic r2 in accordance with the user operation. This enables the user to freely set each of the target amplitude characteristic r1 and the target phase characteristic r2. A degree of freedom for the user to set the filter F is improved. For example, the filter F can be set in accordance with an environment in which the speaker 20 is installed.

Further, the control device 10 changes the degree of correction of the response IR2 based on the priority P. Thus, it is possible to obtain the response IR3 that reflects the target amplitude characteristic r1 and the target phase characteristic r2 in a freely-set balance.

Further, the control device 10 sets the priority P in accordance with the user operation. This enables the user to freely set the priority P. The degree of freedom for the user to set the filter F is improved, and the work of setting the filter F can be supported. For example, it is possible to set the amplitude characteristic r5 and the phase characteristic r6 corresponding to the environment in which the speaker 20 is installed.

Further, when the priority P is changed so as to prioritize the amplitude characteristic, the difference between the amplitude characteristic r5 of the response FR3 and the target amplitude characteristic r1 becomes smaller. When the priority P is changed so as to prioritize the phase characteristic, the difference between the phase characteristic r6 of the response FR3 and the target phase characteristic r2 becomes smaller. The user can intuitively grasp the change of the response FR3 corresponding to the priority P. Through adjustment of the priority P, the user can set, for the filter F, the response FR3 in which the target amplitude characteristic r1 and the target phase characteristic r2 are reflected in a desired balance.

Further, the control device 10 sets the latency value L by the user operation. The user may freely set the latency value L. The degree of freedom for the user to set the filter F is thus improved. For example, it is possible to set the latency value L corresponding to a purpose of use of the speaker 20. For example, for SR purposes, it is preferred to use a shorter latency value (on the order of several tens of milliseconds). For music production purposes, a longer latency value may be set without any problem.

Further, the control device 10 displays the amplitude characteristic r5 of the response FR3 and the target amplitude characteristic r1 in a comparable manner. Further, the control device 10 displays the phase characteristic r6 of the response FR3 and the target phase characteristic r2 in a comparable manner. This facilitates the user's understanding of the difference between the target characteristic and the current characteristic, and can support the user in the work of setting the filter F.

4. Modifications

The present invention is not limited to the embodiment described above, and can be modified suitably without departing from the spirit of the present invention.

For example, the priority P may be set independently for each frequency of the audio signal. In this modification example, the priority P is stored for each frequency band. There are as many priorities P as there are frequency bands. The frequency band and the priority P have a one-to-one relationship. In this modification, there are provided three frequency bands, namely, high, medium, and low frequency bands. The number of frequency bands may be any number. For example, there may be provided two frequency bands or four or more frequency bands.

For example, three priorities P corresponding to the three frequency bands, respectively, are stored. The priorities P for the frequency bands may be different from each other or may be the same. For example, the priorities P for the frequency bands are set independently of each other in accordance with the user operation. The user may be able to set only the priorities P for some frequency bands.

The third processing unit 106 corrects the response IR2 in accordance with a plurality of priorities P for a plurality of frequency bands to obtain the response IR3. When the priority P differs between the two frequency bands, the degree of correction may be crossfaded at a boundary portion between the two frequency bands. The third processing unit 106 corrects the response IR2 to the degrees of correction corresponding to the priorities P for the frequency bands. In this modification, the multiplier 106C multiplies the calculation result of the divider 106B by the degrees of correction based on the plurality of priorities P of the plurality of frequency bands. The process after the correction control unit 106D is as described in the embodiment.

According to the above-mentioned modification, the priority P is set independently for each frequency. Thus, the response IR3 corrected to mutually different degrees of correction for the frequencies is obtained. Through the correction corresponding to the frequencies, the user can more freely control the sound to be output from the speaker 20.

In the embodiment, the case in which trimming is performed after the response IR1 is obtained has been described. The order of steps to be executed by the control device 10 is not limited thereto. For example, the control device 10 may change at least one of the target amplitude characteristic r1 or the target phase characteristic r2 in accordance with the latency value L, and then obtain the response IR1 corresponding to the target amplitude characteristic r1 and target phase characteristic r2 that have been changed.

In the embodiment, the case in which both the target amplitude characteristic r1 and the target phase characteristic r2 are set in accordance with the user operation has been described. At least one of the target amplitude characteristic r1 or the target phase characteristic r2 may be set in accordance with the user operation. For example, only any one of those may be set in accordance with the user operation. Further, for example, both of those may be fixed values without being set in accordance with the user operation.

In the embodiment, the case in which the degree of correction of the response IR2 is changed based on the priority P has been described. The control device 10 may correct the response IR2 without using the priority P in particular. For example, the control device 10 may correct the response IR2 through use of the entire difference between the target amplitude characteristic r1 and the amplitude characteristic r3 of the response FR2 (priority=1). Further, for example, the control device 10 may correct the response IR2 through use of the characteristic obtained by multiplying the difference between the target amplitude characteristic r1 and the amplitude characteristic r3 of the response FR2 by the ratio of the fixed value.

The amplitude characteristic r5 of the response FR3 and the target amplitude characteristic r1 are not required to be displayed in a comparable manner. The phase characteristic r6 of the response FR3 and the target phase characteristic r2 are not required to be displayed in a comparable manner. The filter control screen G is not required to be displayed in particular. The control system is not limited to one control device 10. The control system may include a plurality of devices connected by a network or a serial bus.

What is claimed is:

1. A control method of controlling a frequency response of a filter for processing an audio signal,
   the frequency response being defined by an amplitude characteristic and a phase characteristic,
   the control method comprising:
   acquiring a target amplitude characteristic, a target phase characteristic, and a latency value;
   obtaining a first frequency response in accordance with the target amplitude characteristic and the target phase characteristic;
   obtaining a second frequency response by modifying the first frequency response so that a latency of the second frequency response satisfies the latency value; and
   obtaining a third frequency response to be set for the filter by correcting the second frequency response, the second frequency response being corrected so as to reduce a difference between (i) an amplitude characteristic of the second frequency response and (ii) the target amplitude characteristic.

2. The control method according to claim 1, further comprising setting (i) the target amplitude characteristic in accordance with a user operation, (ii) the target phase characteristic in accordance with a user operation, or both (i) and (ii).

3. The control method according to claim 1, further comprising determining a degree of the correction of the second frequency response based on a priority.

4. The control method according to claim 3, further comprising setting the priority in accordance with a user operation.

5. The control method according to claim 4,
   wherein, in a case where the priority is changed so as to prioritize the amplitude characteristic over the phase characteristic, a difference between an amplitude characteristic of the third frequency response and the target amplitude characteristic becomes smaller, and
   wherein, in a case where the priority is changed so as to prioritize the phase characteristic over the amplitude characteristic, a difference between a phase characteristic of the third frequency response and the target phase characteristic becomes smaller.

6. The control method according to claim 3, wherein the priority is independently settable for a plurality of frequency bands of the audio signal.

7. The control method according to claim 1, further comprising setting the latency value in accordance with a user operation.

8. The control method according to claim 1, further comprising displaying (i) an amplitude characteristic of the third frequency response and the target amplitude characteristic in a comparable manner, (ii) a phase characteristic of the third frequency response and the target phase characteristic in a comparable manner, or both (i) and (ii).

9. A control system for controlling a frequency response of a filter for processing an audio signal, the control system comprising:
   one or more processors; and
   one or more memories,
   wherein the frequency response is defined by an amplitude characteristic and a phase characteristic, and
   wherein the one or more processors are configured to execute a program stored in the one or more memories to cause the control system to:
   acquire a target amplitude characteristic, a target phase characteristic, and a latency value;
   obtain a first frequency response in accordance with the target amplitude characteristic and the target phase characteristic;
   obtain a second frequency response by modifying the first frequency response so that a latency of the second frequency response satisfies the latency value; and
   obtain a third frequency response to be set for the filter by correcting the second frequency response, the second frequency response being corrected by reducing a difference between (i) an amplitude characteristic of the second frequency response and (ii) the target amplitude characteristic.

10. A non-transitory storage medium, comprising one or more storage media having stored thereon a computer-readable program for controlling a frequency response of a filter for processing an audio signal,
    wherein the frequency response is defined by an amplitude characteristic and a phase characteristic, and
    wherein the computer-readable program causes one or more processors to perform operations of:
    acquiring a target amplitude characteristic, a target phase characteristic, and a latency value;
    obtaining a first frequency response in accordance with the target amplitude characteristic and the target phase characteristic;
    obtaining a second frequency response by modifying the first frequency response so that a latency of the second frequency response satisfies the latency value; and
    obtaining a third frequency response to be set for the filter by correcting the second frequency response, the second frequency response being corrected by reducing a difference between (i) an amplitude characteristic of the second frequency response and (ii) the target amplitude characteristic.

* * * * *